(12) United States Patent
Sinclair

(10) Patent No.: US 6,844,749 B2
(45) Date of Patent: Jan. 18, 2005

(54) INTEGRATED CIRCUIT TEST PROBE

(75) Inventor: William Y. Sinclair, Frenchtown, NJ (US)

(73) Assignee: Aries Electronics, Inc., Frenchtown, NJ (US)

( * ) Notice: Subject to any disclaimer, the term of this patent is extended or adjusted under 35 U.S.C. 154(b) by 4 days.

(21) Appl. No.: 10/602,480

(22) Filed: Jun. 23, 2003

(65) Prior Publication Data
US 2004/0012402 A1 Jan. 22, 2004

Related U.S. Application Data

(60) Provisional application No. 60/397,223, filed on Jul. 18, 2002.

(51) Int. Cl.$^7$ .............................................. G01R 31/02
(52) U.S. Cl. ....................... 324/761; 324/754; 439/482; 439/700
(58) Field of Search ................................. 324/761, 762, 324/754, 757, 158.1, 72.5, 758; 439/482, 700, 66

(56) References Cited

U.S. PATENT DOCUMENTS

| | | | |
|---|---|---|---|
| 4,508,405 A | * 4/1985 | Damon et al. | .............. 439/260 |
| 4,783,624 A | 11/1988 | Sabin | |
| 4,918,384 A | 4/1990 | Giringer et al. | |
| 5,009,613 A | 4/1991 | Langgard et al. | |
| 5,204,615 A | 4/1993 | Richards et al. | |
| 5,225,773 A | 7/1993 | Richards | |
| 5,557,213 A | 9/1996 | Reuter et al. | |
| 5,877,554 A | 3/1999 | Murphy | |
| 5,990,697 A | * 11/1999 | Kazama | ..................... 324/761 |
| 6,020,635 A | 2/2000 | Murphy | |
| 6,046,597 A | * 4/2000 | Barabi | ........................ 324/755 |
| 6,104,205 A | 8/2000 | Mawby | |
| 6,159,056 A | * 12/2000 | Boyle | ......................... 439/700 |
| 6,341,962 B1 | 1/2002 | Sinclair | |
| 6,685,492 B2 | * 2/2004 | Winter et al. | ............... 439/219 |
| 6,696,850 B1 | * 2/2004 | Sanders | ..................... 324/761 |

FOREIGN PATENT DOCUMENTS

| | | |
|---|---|---|
| JP | 2002090386 | 3/2002 |
| WO | WO 02/01232 | 1/2000 |
| WO | WO 01/37381 | 5/2001 |

* cited by examiner

Primary Examiner—David A. Zarneke
Assistant Examiner—Jimmy Nguyen
(74) Attorney, Agent, or Firm—Anthony J. Casella; Gerald E. Hespos

(57) ABSTRACT

A test probe consists of an elongated screw machine contact biased by a helical spring and mounted in a through hole of a non-conductive substrate. One end of the contact includes a crown for engaging a solder ball lead of an IC package, and the contact includes an intermediate collar which maintains the contact within the through hole. The helical spring is disposed about the contact, with one end thereof engaging the lower end of the collar. The other end of the helical spring has contiguous coils and is of a reduced diameter so as to extend beyond the lower end of the non-conductive substrate to make electrical contact with a printed circuit board. When the test probe is compressed between the IC package and the printed circuit board, the inherent twisting of the helical spring causes the contact to tilt and make electrical contact with the contiguous coils, thereby establishing a direct electrical path between the IC package and the printed circuit board, with minimum resistance and minimum inductance.

9 Claims, 5 Drawing Sheets

INTEGRATED CIRCUIT TEST PROBE

This application claims priority from U.S. provisional application Ser. No. 60/397,223, filed Jul. 18, 2002, which is incorporated herein by reference.

BACKGROUND OF THE INVENTION

1. Technical Field

The subject invention pertains generally to test probes. More specifically, the subject invention pertains to a new and improved integrated circuit ("IC") test probe for use in various testing applications. Furthermore, the subject invention is capable of being employed in several different configurations that permit it to be used with a variety of IC chips.

An electrical component, such as an IC, must be tested and evaluated for reliability before actual use. For proper testing and evaluation, the IC must be electrically connected to a printed circuit board ("PCB") by a reliable means. As the microelectronic field has advanced, the complexity and concentration of components in an IC has increased dramatically. This increase has lead to an increased lead density of the IC chip with a corresponding decrease in the gap between the leads. Therefore, a need for smaller sized test probes to accommodate these increasingly complex ICs is needed.

Ball grid array (BGA) and land grid array (LGA) packages have become increasingly popular because of their high densities and low profiles. With a BGA package, the rounded solder balls of the BGA are usually soldered directly to a corresponding surface mount pad of a printed circuit board, rather than the pins of a pin grid array IC package.

Another method of enabling IC packages to be interchanged is by use of sockets such that there is no permanent connection between the IC package and the circuit board. The sockets for use with BGA and LGA packages have been developed so as to allow those packages to be non-permanently connected to a circuit board, such as when it is for purposes of testing. However, problems can exist in attaching a BGA package to a conventional socket. More particularly, this comes about because a BGA package presents a non-traditional mating condition. The rounded solder balls of the BGA provide relatively poor points of contact for soldering, as they are suited only for their intended purpose of being reflowed. Furthermore, the co-planarity between the individual points of contact for each rounded solder ball may be lacking due to ball irregularities and warping of the BGA package.

2. Background of the Related Art

Accordingly, the art has seen improvements in coping with the increased complexity and density of BGA packages. An example of such a device is disclosed in U.S. Pat. No. 5,204,615 that issued to Richards et al. on Apr. 20, 1993. Richards et al. discloses a module comprising an insulating material, a generally T-shaped slot for mounting on the test probes, a chisel tipped test lead for contacting the IC and a connection end on the opposite side of the substrate for soldering to a wire lead.

However, the device of Richards et al. is designed to score the connection surface of one device and is not designed for high frequency applications. Scoring the surface of a component to remove the insulating coating is not desirable since it permits contaminants to contact the component's surface causing oxidation of the surface that results in lower conductivity of the junction.

Another prior art test probe is of the spring-loaded electrical contact probe type, as disclosed in U.S. Pat. No. 5,557,213 which issued to Reuter, et al. on Sep. 17, 1996. Reuter, et al. discloses an electrical spring probe including a barrel having an annular opening therethrough, with a plunger being partially disposed within the annular opening at one end and capable of slideable axial displacement within the annular opening. The plunger of Reuter, et al. includes a tip positioned outside of the barrel for contacting an electrical device. A terminal member is disposed within the annular opening through the barrel at an end opposite to the plunger and is fixedly attached therein. The terminal member includes a flanged end that is positioned outside of the barrel and includes at least one flange that extends radially outward from the flanged end. The flange has a shoulder that is substantially perpendicular to an axis running along the terminal member. A slot is positioned in the flanged end and extends axially along the terminal member from the tip of the flanged end a distance toward the barrel. The spring probe forms a locked attachment with a probe receptacle by a snap locking abutment of the shoulder of each flange with an outside edge of an opening in a terminal portion of the receptacle. The Reuter, et al. spring contact probe has, as described above, numerous components, is difficult to assemble, and is costly. In addition, because of the many components, the electrical path during a testing operation is quite circuitous, thereby limiting the high frequency testing application of the Reuter, et al. probe.

Another prior art socket terminal is disclosed in U.S. Pat. No. 5,877,554 which issued to Murphy on Mar. 2, 1999. In Murphy, there is disclosed a socket terminal assembly including a socket body having an end with an opening and an opposite end configured to contact a corresponding connection region of a printed circuit board, and a contact spring, disposed at the opening of the socket body, to receive and apply a frictional force sufficient to retain the lower end of a pin within the opening of the socket body. The socket terminal also includes a resilient member, disposed within a lower end of the opening, to apply to the pin and in response to a downward force applied to the pin, and upward force sufficient to overcome the frictional force of the contact spring. The Murphy pin has an end adapted to contact an electrical contacting area of an integrated circuit package and an opposite end configured to be inserted within the opening of the socket body. An intercoupling component includes a socket support member having holes, each hole receiving a corresponding socket terminal assembly. Because of the construction of the Murphy socket terminal, the electrical path between the printed circuit board and the BGA component is also circuitous, and the numerous components result in an expensive socket terminal. Furthermore, for RF applications, the circuitous electrical path results in high resistance, thereby limiting the application of the socket terminal.

Other prior art spring contact probes including multiple parts are disclosed in U.S. Pat. Nos. 4,783,624; 5,009,613; 5,225,773; and 6,104,205, all of which are assigned to Interconnect Devices, Inc. of Kansas City, Kans.

Accordingly, it is an object of the subject invention to provide a new and improved test probe small enough to accommodate the increased density of leads on modern IC chips.

A further object of the subject invention is to provide a test probe that has durable and flexible contacts for connecting a component to a PCB.

A further object of the subject invention is to provide a reliable test probe that will continue to operate as designed after numerous operational cycles.

Yet another objective of the subject invention is to provide a test probe that is capable of accepting ball grid array ("BGA") or land grid array ("LGA") chips.

A further object of the subject invention is to provide a new and improved test probe that is inexpensive to manufacture and has a minimum number of parts.

A further object of the subject invention is to provide a test probe that does not damage the surface of the PCB.

Another object of the subject invention is to provide a test probe that is suitable for use in high frequency test applications.

A still further object of the subject invention is to provide a test probe which is operative to establish a minimum resistance, minimum inductance electrical connection between the lead of an integrated circuit and a printed circuit board.

SUMMARY OF THE INVENTION

The subject invention provides for a new and improved test probe for connecting an IC chip to a printed circuit board. The subject invention further provides for a new and improved test probe that is small enough to be used in the densities required by state of the art integrated circuit chips. In operation, the test probe of the subject invention maintains high electrical connectivity, while maintaining a low insertion force parameter so as to extend the life of the test probe and minimize damage to the leads of the IC chips under test.

In a preferred embodiment of the subject connector assembly for forming a plurality of electrical connections between an IC package and a printed circuit board, the connector assembly includes a non-conductive substrate having a plurality of annular through holes extending between the top and bottom surfaces thereof. Each through hole has an enlarged diameter portion intermediate the top and bottom surfaces, and a corresponding plurality of resilient electrical probes are disposed in the through holes. Each electrical probe is formed from an elongated contact and a helical spring. The elongated contact has an intermediate enlarged diameter collar portion which is located within the enlarged diameter portion of the through hole, while a first end of the elongated contact extends beyond the top surface of the substrate and includes a crown portion for engaging the IC lead, for example, a BGA lead. The opposite or second end of the elongated contact is disposed within the through hole and is of smaller diameter than the diameter of the collar portion of the contact.

The elongated helical spring of the subject electrical probe is disposed about the elongated contact and has an upper portion, an intermediate portion, and a lower portion. The upper portion of the spring is disposed within the enlarged diameter portion of the through hole and bears against the lower side of the collar of the elongated contact. As is inherent in any helical spring, the plane of the top surface of the upper portion of the helical spring is inclined relative to the plane of the bottom of the collar. Stated differently, the plane of the top portion of the spring is not orthogonal to the longitudinal axis of the through hole. In other words, the upper portion of the spring is not flush with the bottom surface of the collar, and only a portion of the spring bears against the collar. This physical characteristic of the subject contact is extremely important in the operation of the connector assembly, as will be explained hereinafter. The intermediate portion of the spring is wholly disposed within the through hole and is of greater diameter than the diameter of the second end of the elongated contact.

The lower spring portion of the spring is tightly wound such that the coils are contiguous, with the diameter of the lower spring portion being smaller than the diameter of the through hole at the bottom surface of the substrate. The internal diameter of the lower spring portion is greater than the diameter of the second end of the contact. The lower spring portion extends outside of the through hole for connection to the printed circuit board.

During a testing operation, a pad of the printed circuit board is brought into contact with the lower spring portion so as to make electrical contact and to partially compress the helical spring. Next, an integrated circuit package is pressed against the connector assembly, i.e., a solder ball is engaged by the crown of the elongated contact. As the spring is further compressed, because of the inclination of the top plane of the spring relative to the bottom of the collar of the contact, the elongated contact is tilted such that the longitudinal axis of the contact is at an acute angle with the longitudinal axis of the through hole. At such time the second end of the elongated contact makes electrical contact with the contiguous coils of the lower spring portion. This results in a direct electrical path from the solder ball through the entire length of the contact, through the contiguous coils of the lower spring portion, and to the pad on the printed circuit board.

The subject invention establishes electrical contact between an IC package and a printed circuit board with a minimum of resistance and inductance, and in a manner to enable its use in high frequency applications.

DETAILED DESCRIPTION OF THE DRAWINGS

DETAILED DESCRIPTION OF THE PREFERRED EMBODIMENT

Figure 1:
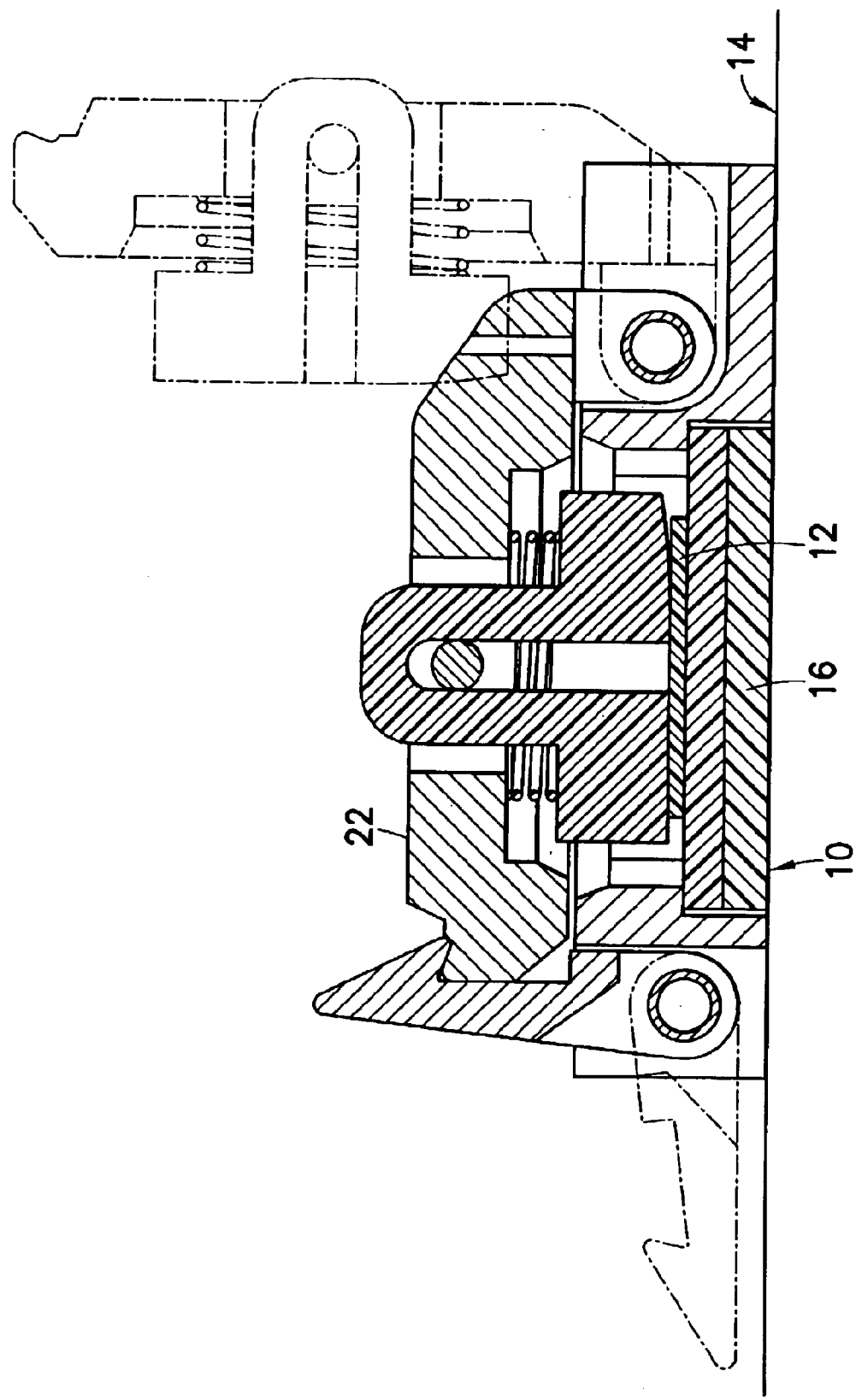
FIG. 1 is a cross-sectional view of a chip scale package burn-in socket employing the connector of the subject invention.

Referring to FIGS. 1–4, a new and improved connector assembly 10 is provided for connecting an IC package 12 to a printed circuit board 14. The connector 10 includes a non-conductive substrate 16 with a plurality of electrical probes 18 mounted in through holes 20 formed through the substrate 16. The number of the electrical probes 18 will generally correspond to the number of lands provided with the IC package 12. Also, the size of the connector 10 is also generally dependent on the size of the IC package 12. For purposes of illustration, the connector 10 of the subject invention will be shown and described in connection with a ball grid array (BGA) 12 package to a chip scale package (CSP) burn-in socket 22, as shown in FIG. 1.

It should be noted that the connector 10 need not be formed with the same dimensions as the IC package 12 for purposes of this invention. However, the electrical contacts 18 must be disposed in the connector 10 such that the pressing contact is achieved between the electrical probes 18 and the balls 24 of the integrated circuit 12, with the connector 10 being placed in face-to-face contact with the integrated circuit 12. The solder balls 24 may be disposed to define a plurality of rows and columns throughout the surface 26 of the integrated circuit 12. Consequently, although not shown, the electrical probes 18 are to be aligned in a similar row-column pattern.

Figure 2:
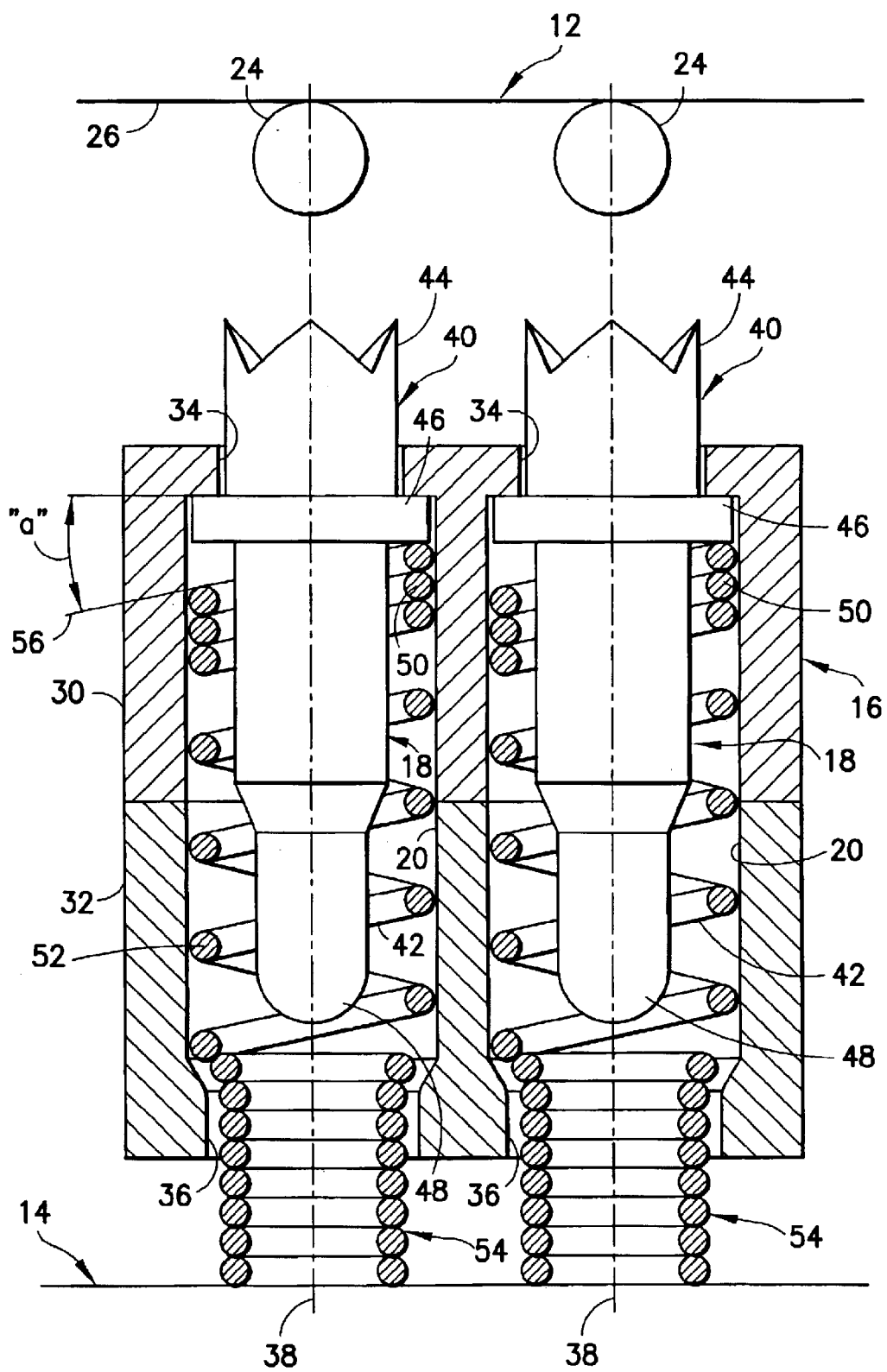
FIG. 2 is a cross-sectional view of the connector of the subject invention where the electrical contact probe is in its initial rest position.

Referring to FIG. 2, the non-conductive substrate 16 is preferably formed of two layers 30, 32 which are bonded together and which define the through holes 20. Each through hole 20 includes an intermediate portion which is of uniform annular diameter, and each through hole 20 has a restricted upper opening 34 and a restricted lower opening 36 of reduced diameter. The longitudinal axis of the through hole 20 is designated by the numeral 38.

Each electrical probe 18 includes a screw machined elongated contact 40 and a helical spring 42.

The elongated contact 40 includes at its upper or first end a crown portion 44 for engaging a solder ball lead 24, an intermediate collar 46 and a lower or second end 48. The collar 46 is of slightly smaller diameter than the enlarged diameter portion of the through hole 20, and is disposed within the through hole and confined within the through hole by the restricted opening 34. The crown 44 projects above the top layer 30 of the non-conductive substrate 16, while the portion of the contact 40 disposed below the collar 46, including the second end 48, is wholly disposed within the nonconductive substrate 16. As shown in FIG. 2, the lower or second end 48 of the contact 40 is of smaller diameter than the diameter of the lower restricted opening 36.

The spring 42 is generally cylindrically shaped and is formed from material having good spring characteristics, such as beryllium copper, which permits resilient contraction of the spring 42 relative to the substrate 16. The generally cylindrical resilient spring 42 is formed from a single unitary conductor which is coiled in a helical fashion. Spring 0.42 includes an upper portion 50, an intermediate portion 52, and a lower portion 54.

Preferably, the upper portion 50 of the spring 42 is formed of coils which are contiguous and which are of a diameter corresponding to the diameter of the collar 46. The upper coil of the coil portion 50 of the spring 42 bears against the lower surface of the collar 46. Because of the inherent characteristics of helical coil springs, the plane 56 of the top of the coiled spring 42 is disposed at an acute angle "a" to the generally horizontal plane of the lower portion of the collar 46. As a result, only a portion of the upper spring portion 50 is initially in contact with the collar 46, as illustrated in FIG. 2.

The intermediate coil portion 52 of the spring 42 is of open pitch configuration so as to be capable of being longitudinally compressed under the action of opposing forces. As shown in FIG. 2, the diameter of the intermediate portion 52 of the spring 42 is less than the inner diameter of the through hole 20.

The lower spring portion 54 of spring 42 also has coils which are contiguous, with the outer diameter of the lower spring portion 54 being less than the diameter of the restricted opening 36 in order to enable the lower spring portion 54 to extend beyond the lower surface of the substrate 16 to make electrical contact with the printed circuit board 14. The inner diameter of the lower spring portion 54 is greater than the diameter of the lower or second end 48 of the elongated contact 40.

Figure 3:
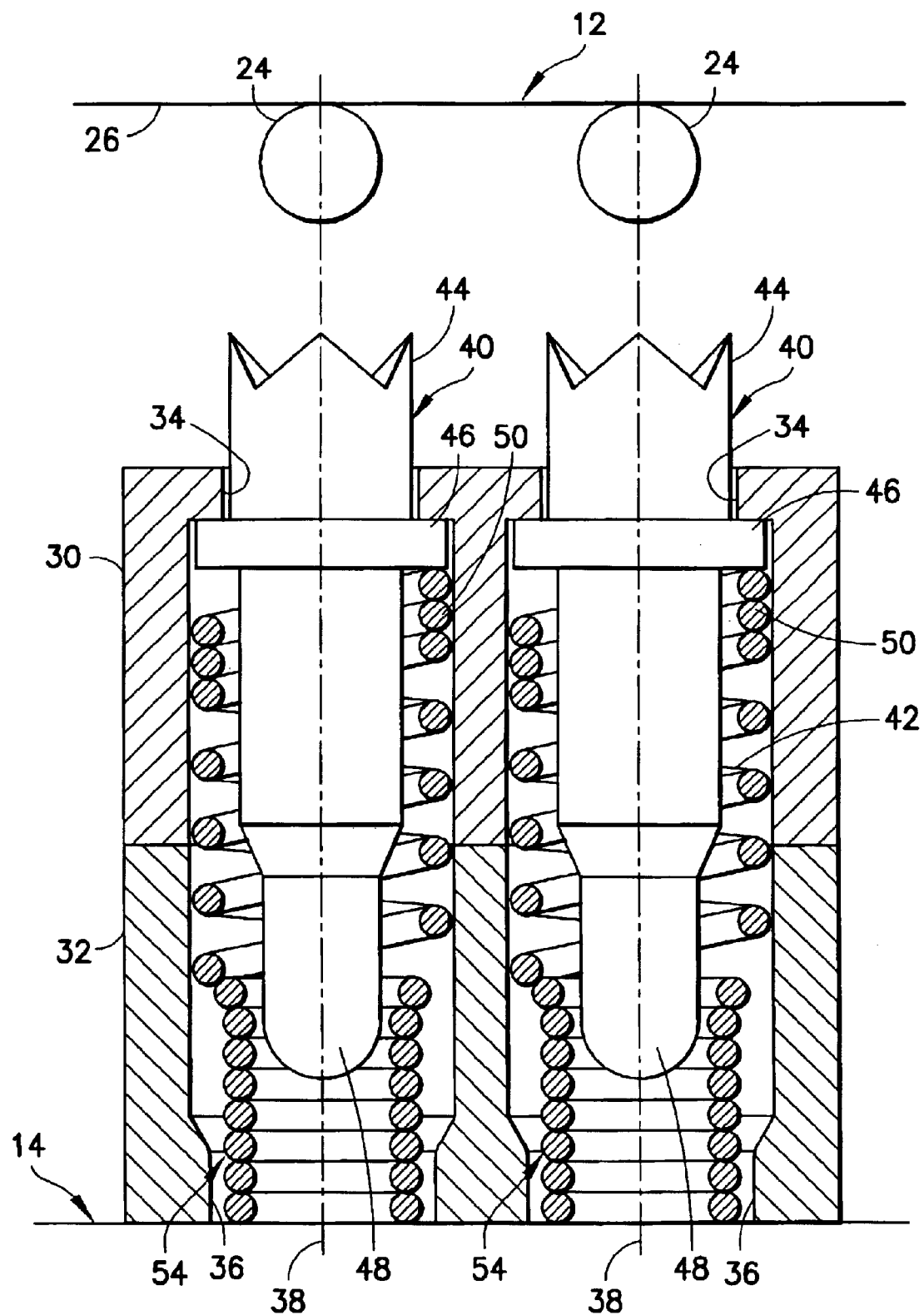
FIG. 3 is a cross-sectional view of the connector of the subject invention where the electrical probe is in contact with the printed circuit board and is partially compressed.

Referring to FIG. 3, in this position of the connector assembly, the connector assembly has been actuated downwardly so as to cause an electrical connection between the spring 42 and the printed circuit board 14, and the intermediate spring portion 52 is compressed to accommodate the retraction of the lower spring portion 54 into the through hole 20.

Figure 4:
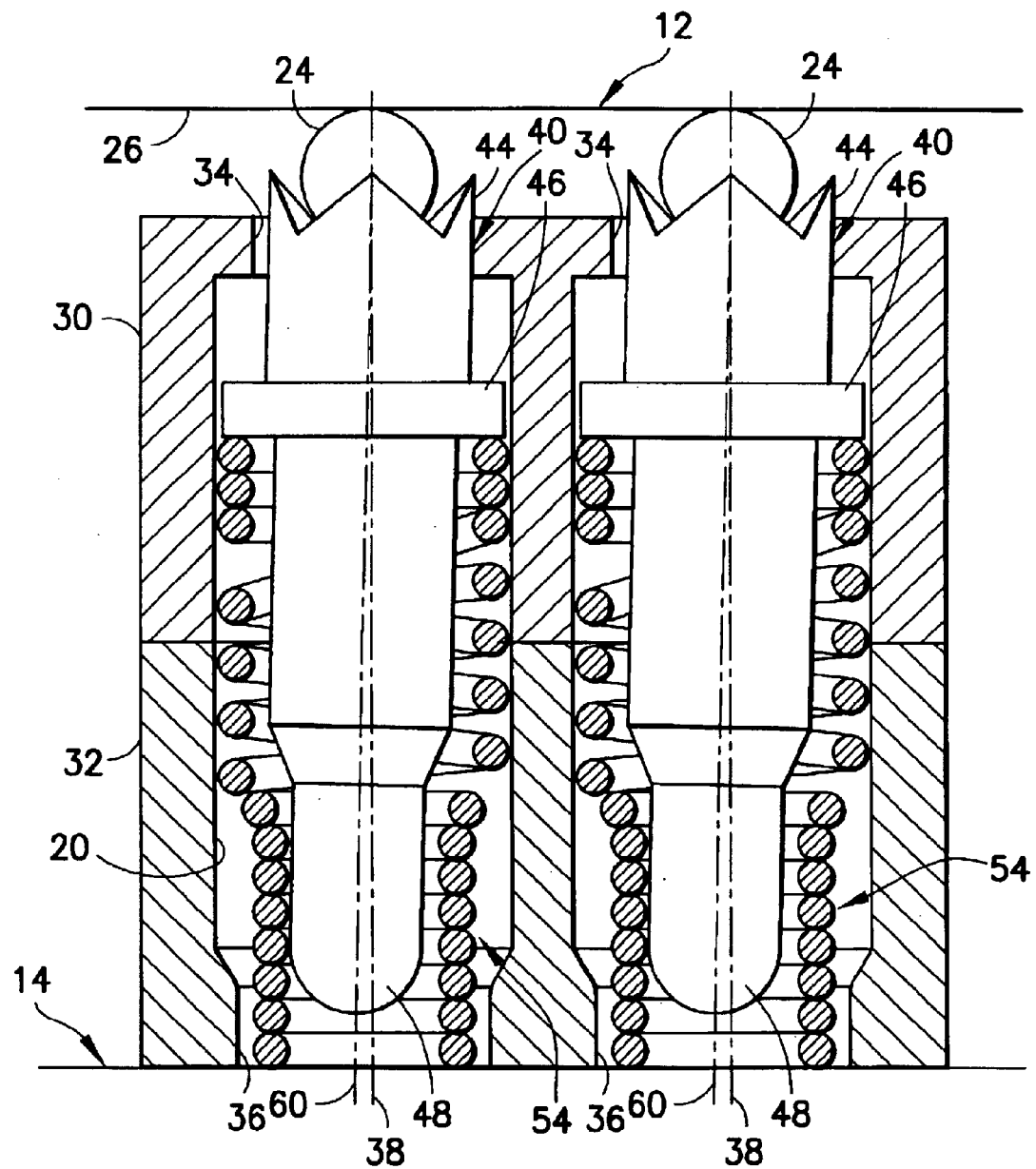
FIG. 4 is a cross-sectional view of the connector of the subject invention where the electrical probe is in contact with the printed circuit board and the solder ball of the IC package and is fully compressed.

Referring to FIG. 4, as the integrated circuit 12 is pressed into the connector assembly, each solder ball 24 engages the crown 44 of a contact 40, thereby resulting in downward movement of the contact 40.

As the contact 40 is moved downwardly into the non-conductive substrate 16, the collar 46 bears against the upper spring portion 50 and, because of the inclined plane 56 of the upper spring portion 50, the contact 40 is forced to rotate or tilt, such that the longitudinal axis 60 of the contact is at an acute angle to the longitudinal axis 38 of the through hole 20. In the position as illustrated in FIG. 4, the lower or second end 48 of the contact 40 makes electrical contact with the lower spring portion 54 thereby providing a direct electrical path from the solder ball lead 24, through the length of the contact 40, through the contiguous lower coils 54 and to the printed circuit board 14.

In effect, the contiguous coils 54 of the spring 42 are equivalent to a solid cylindrical contact. As a result, the electrical path between the integrated circuit 12 and the printed circuit board 14 is a direct, almost straightforward path which minimizes resistance and inductance, and enables the contact to operate at higher frequencies.

The electrical probe 18 of the subject invention is suitable for RF applications in the 5–10 gigahertz range, and the combination of elements has a life span of 10,000 chip insertion and removal cycles without loss of compressibility, electricity or electrical conductivity.

Figure 5:
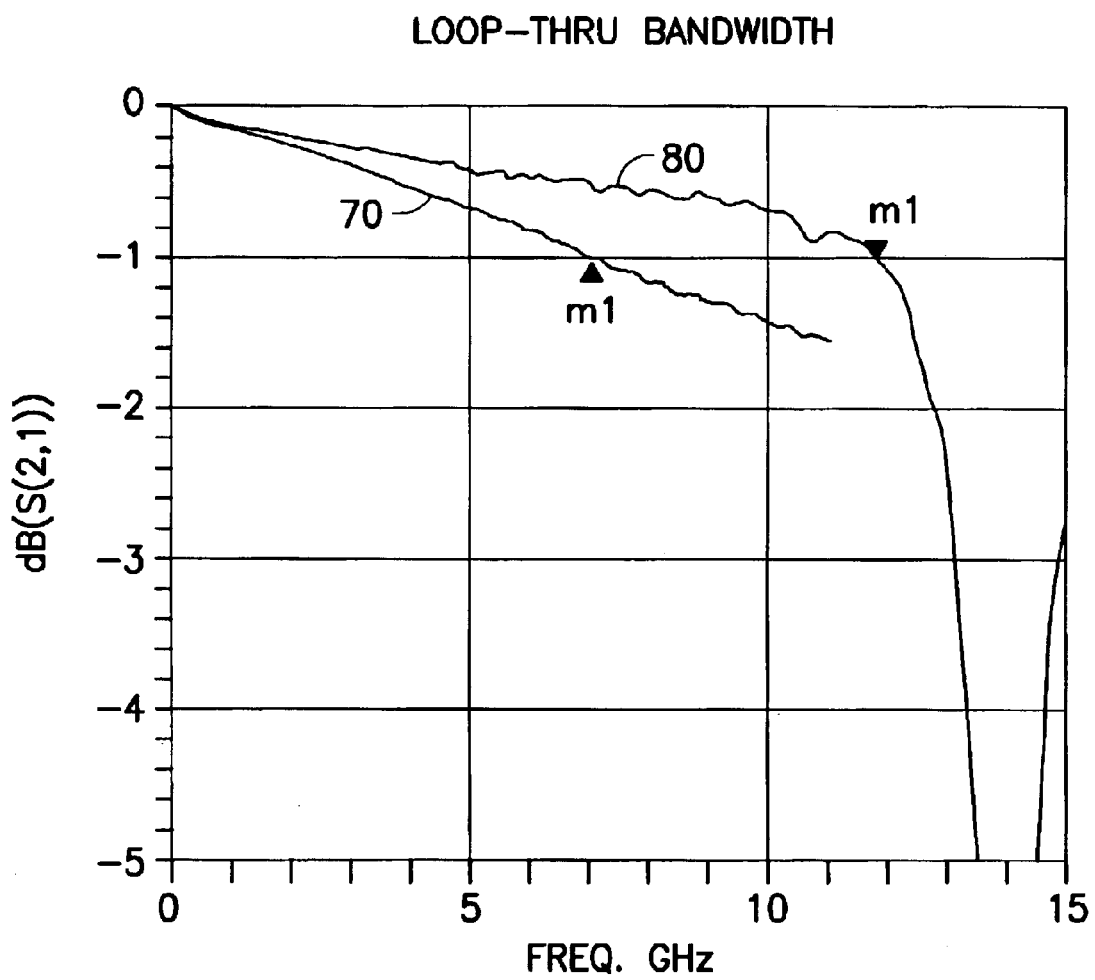
FIG. 5 is a graph comparing the electrical characteristics of the connector of the subject invention and a prior art connector.

As an example, reference is made to FIG. 5 which is a comparison of a 0.5 mm BGA socket made according to the subject invention, as compared to a competitor's 0.5 mm BGA socket. The comparative tests were conducted by an independent testing lab, and both sockets were measured to assess their electrical performance. In particular, each socket's high speed performance limits were determined.

In the case of the prior art 0.5 mm BGA socket of the competitor, the results depicted by the line 70 indicates that the 1 dB bandwidth was at a maximum of 6.4 GHz.

The high-speed performance limits of the 0.5 mm BGA socket of the subject invention, at 1 dB, is indicted by the line 80, with the results being at 11.4 GHz, almost twice the high frequency performance characteristics of the prior art socket.

As is readily apparent, numerous modifications and changes may readily occur to those skilled in the art, and hence it is not desired to limit the invention to the exact construction and operation shown and described. Accordingly, all suitable modification equivalents may be resorted to as falling within the scope of the invention as claimed.

What is claimed is:

1. An electrical test probe for a connector assembly comprising:

an elongated contact having an intermediate collar; and an elongated helical coil spring disposed about said contact, with one end of the spring bearing against one side of said intermediate collar such that the plane of the spring is at an acute angle to said one side of the collar, and wherein the opposite end of the spring includes contiguous spring coils, the diameter of said contiguous coils at said opposite end of the helical coil being of smaller diameter than the diameter of the coils at said one end of the spring, whereby, in operation, when the electrical probe is compressed between a printed circuit board and an integrated circuit, the longitudinal axis of the contact is skewed to establish a direct electrical path between the contact and the contiguous spring coils of the spring.

2. An electrical test probe as in claim 1 wherein the elongated contact has at one end thereof a crown configuration for engaging the solder ball of a BGA integrated circuit, while the opposite end of said elongated contact is disposed within said contiguous spring coils of the helical coil spring.

3. An electrical test probe for a connector assembly as in claim 1 wherein said one end of the spring includes contiguous spring coils.

4. An electrical test probe for a connector assembly as in claim 1 wherein the intermediate portion of the elongated helical coil spring is of constant pitch.

5. An electrical test probe for a connector assembly as in claim 1 wherein the helical coil spring is made of beryllium copper.

6. An electrical test probe for a connector assembly as in claim 1 wherein the connector assembly includes a non-conductive substrate having opposed top and bottom surfaces and a plurality of annular through holes extending between said top and bottom surfaces, each said through hole having an enlarged diameter portion intermediate said top and bottom surfaces, and wherein a plurality of electrical test probes corresponds to said plurality of through holes, with each test probe being disposed within a through hole.

7. A connector assembly for forming a plurality of electrical connections between an integrated circuit package and a printed circuit board, said connector assembly comprising:

a non-conductive substrate having opposed top and bottom surfaces and a plurality of annular through holes extending between said top and bottom surfaces, each said through hole having an enlarged diameter portion intermediate said top and bottom surfaces; and a plurality of resilient electrical probes corresponding to said plurality of through holes, each said electrical probe being formed from an elongated contact and a helical spring, said elongated contact having an intermediate enlarged diameter collar portion disposed within said enlarged diameter portion of said through hole, with a first end of said elongated contact extending beyond the top surface of said substrate, while the second end of said elongated contact is disposed within said through hole and is of smaller diameter than said collar portion thereof, said elongated helical spring being disposed about said elongated contact and having an upper portion, an intermediate portion, and a lower portion, said upper spring portion bearing against one side of said enlarged diameter collar and being tightly wound such that the coils thereof are contiguous, said intermediate spring portion being wholly disposed within said through hole and being of a diameter greater than the diameter of said second end of the elongated contact, and said lower spring portion being also tightly wound such that the coils are contiguous, said lower spring portion being of a diameter smaller than the through hole at the bottom surface of the substrate so as to extend beyond said bottom surface for connection to a printed circuit board whereby, in the operative position of the electrical probe, the collar of said elongated contact bears against the upper portion of said spring resulting in tilting of said elongated contact such that the second end thereof makes electrical contact with said lower spring portion.

8. A connector assembly for forming a plurality of electrical connections between an integrated circuit package and a printed circuit board as in claim 7, wherein said helical spring is made of beryllium copper.

9. A connector assembly for forming a plurality of electrical connections between an integrated circuit package and a printed circuit board as in claim 7, wherein said first end of the elongated contact is formed with a crown configuration for engagement with a solder ball of a BGA integrated circuit package.

* * * * *